United States Patent
Mutaguchi

(10) Patent No.: US 7,051,915 B2
(45) Date of Patent: May 30, 2006

(54) CAPILLARY FOR WIRE BONDING AND METHOD OF WIRE BONDING USING IT

(75) Inventor: Yoshihiko Mutaguchi, Kyoto (JP)

(73) Assignee: ROHM Co., Ltd., Kyoto (JP)

( * ) Notice: Subject to any disclaimer, the term of this patent is extended or adjusted under 35 U.S.C. 154(b) by 0 days.

(21) Appl. No.: 10/649,654

(22) Filed: Aug. 28, 2003

(65) Prior Publication Data
US 2004/0041000 A1 Mar. 4, 2004

(30) Foreign Application Priority Data
Aug. 29, 2002 (JP) .............................. 2002-249940

(51) Int. Cl.
B23K 37/00 (2006.01)
B23K 31/02 (2006.01)

(52) U.S. Cl. ..................... 228/4.5; 228/180.5
(58) Field of Classification Search ................. 228/1.1, 228/4.5, 180.5
See application file for complete search history.

(56) References Cited

U.S. PATENT DOCUMENTS

| | | | | |
|---|---|---|---|---|
| 4,405,074 A | * | 9/1983 | Levintov et al. | ............... 228/41 |
| 4,901,550 A | * | 2/1990 | Koide et al. | ..................... 72/38 |
| 5,437,405 A | * | 8/1995 | Asanasavest | ............. 228/180.5 |
| 5,558,270 A | * | 9/1996 | Nachon et al. | .......... 228/180.5 |
| 5,662,261 A | * | 9/1997 | Fogal | ......................... 228/4.5 |
| 5,764,074 A | * | 6/1998 | Wykes et al. | ................. 326/27 |
| 5,984,162 A | * | 11/1999 | Hortaleza et al. | ........ 228/110.1 |
| 6,352,197 B1 | * | 3/2002 | Mutaguchi | ............... 228/180.5 |
| 6,457,627 B1 | * | 10/2002 | Komiyama | ................. 228/4.5 |
| 6,673,310 B1 | * | 1/2004 | Tadauchi et al. | ............ 420/557 |
| 6,715,658 B1 | * | 4/2004 | Perlberg et al. | .............. 228/4.5 |
| 6,877,648 B1 | * | 4/2005 | Higashiyama | .............. 228/1.1 |
| 2004/0056072 A1 | * | 3/2004 | Chapman et al. | ........ 228/180.5 |

FOREIGN PATENT DOCUMENTS

JP 11-54539 A * 2/1999

\* cited by examiner

*Primary Examiner*—Lynne R. Edmondson
(74) *Attorney, Agent, or Firm*—Arent Fox PLLC

(57) ABSTRACT

A capillary has a face surface 13 formed at the tip end thereof so that the face surface 13 inclines toward the center thereof so as to have a tapered shape, and has a through hole 11 formed therethrough so as to permit wire to be placed therethrough so that the through hole 11 has an opening 12 at the center of the face surface 13. The inclination angle $\theta$ of the face surface 13 relative to the plane perpendicular to the axis of the capillary and including the opening 12 of the through hole 11 is in the range from 4° to 15°, and the height h of the face surface 13 along the axis of the capillary is equal to or greater than the thickness of the wire 2.

6 Claims, 3 Drawing Sheets

CAPILLARY FOR WIRE BONDING AND METHOD OF WIRE BONDING USING IT

BACKGROUND OF THE INVENTION

1. Field of the Invention

The present invention relates to a capillary used for wire bonding and to a method of wire bonding using such a capillary. More particularly, the present invention relates to a capillary used to mount semiconductor devices and the like, and to a method of wire bonding using such a capillary.

2. Description of the Prior Art

A conventionally widely practiced method of mounting a semiconductor device on a leadframe or circuit board is wire bonding, a method whereby electrodes are connected together with wires. Common wire bonding is performed roughly in the following manner. First, the tip of wire extracted from a capillary through the opening formed at the tip thereof is formed into a ball-like shape by electric discharge or the like. Then, the capillary is moved to above one electrode and then down so that the tip of the wire formed into the ball-like shape bonds to the electrode (this operation is called first bonding). At this time, to increase the bonding strength with which the wire bonds, a supersonic vibration is applied thereto. Next, the capillary is moved to above another electrode and then down so that the wire bonds to the electrode (this operation is called second bonding). Also at this time, to increase the bonding strength with which the wire bonds, a supersonic vibration is applied thereto.

Here, the second bonding is achieved by pressing and thereby deforming the wire with the face surface of the capillary so that the wire bonds to the electrode, a method called stitch bonding. In such stitch bonding, the shape of the face surface of the capillary, i.e., the surface at the tip end thereof, greatly influences how the wire bonds to the electrode.

As shown in FIG. 4, the shape at and around the tip of a conventional capillary 1' is such that, relative to the thickness of wire 2, the width of the capillary (if it is cylindrical, its diameter) is small, and the area of its face surface 13 is also small. For this reason, the curved-surface portion 15 of the capillary, i.e., the portion thereof rounded to connect the face surface 13 to the peripheral surface 14 thereof, is also used to press and deform the wire 2.

However, with the curved-surface portion 15 of the capillary, the wire 2 cannot be pressed and deformed to a sufficient degree. This sometimes leaves part of the wire 2 unbonded and suspended off the electrode 31. In the fabrication process, such a gap between the wire 2 and the electrode 31 causes mechanical and thermal stress to concentrate at the boundary between the bonded and unbonded portions of the wire 2. This sometimes causes the wire to break at that portion.

This phenomenon occurs relatively frequently when second bonding is performed on top-surface electrodes of semiconductor devices. Through experiments, the inventor of the present invention has found that such wire breakage occurs with a far higher probability, namely in one in several tens of top-surface electrodes, when second bonding is performed thereon than when first bonding is performed thereon, in which case the probability is in one in several tens of thousands of top-surface electrodes.

SUMMARY OF THE INVENTION

An object of tie present invention is to pro-vide a capillary that permits firm bonding of wire to electrodes in stitch bonding while preventing breakage and peeling-off of the wire after bonding.

Another object of the present invention is, in a method of wire bonding whereby first bonding is performed on an external electrode and second bonding is performed on a top-surface electrode of a semiconductor device, to prevent breakage and peeling-off of the portion of wire that has been subjected to second bonding.

To achieve the above objects, according to one aspect of the present invention, a capillary used to perform wire bonding has a face surface formed at the tip end thereof in such a way that the face surface inclines toward the center thereof so as to have a tapered shape, and has a through hole formed therethrough so as to permit wire to be placed therethrough in such a way that the through hole has an opening at the center of the face surface. Here, the angle of inclination of the face surface relative to the plane perpendicular to the axis of the capillary and including the opening of the through hole is in the range from 4° to 15°, and the height of the face surface along the axis of the capillary is equal to or greater than the thickness of the wire. With this structure, when wire is bonded to an electrode by stitch bonding, it is possible to permit the wire to bond to the electrode over a wider bonding area than ever, and to permit the load applied to the capillary to be effectively transmitted to the wire. This helps to effectively prevent troubles such as breakage and peeling-off of the wire. It should be noted that, in the present specification, the inclination angle θ and height h of the face surface denote those shown in FIG. 1.

According to another aspect of the present invention, in a method of wire bonding including the steps of bonding wire to an external electrode and then bonding the wire to a top-surface electrode of a semiconductor device, the capillary described above is used to perform wire bonding. This helps to make the semiconductor device thin while securing a sufficient wire loop length, and to achieve firm bonding of the wire to the top-surface electrode of the semiconductor device.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

In search of a way of firmly bonding wire to an electrode in stitch bonding, the inventor of the present invention studied various shapes of the face surface of a capillary, and found that the aim is achieved by giving the face surface an inclination angle and a height in predetermined ranges respectively.

Specifically, in a capillary according to the present invention, it is important to give its face surface an inclination angle in the range from 4° to 15°. If the inclination angle of the face surface is smaller than 4°, the capillary is too thick relative to the height of the face surface, which will be described later. This makes it difficult to bond wire with high density. On the other hand, if the inclination angle of the face surface is larger than 15°, the pressing force is not sufficiently transmitted to wire via the face surface, resulting in imperfect bonding of the wire to electrodes. A further preferred range of the inclination angle of the face surface is from 8° to 12°.

In a capillary according to the present invention, it is also important to give the face surface a height equal to or greater than the thickness of wire. If the height of the face surface is smaller than the thickness of the wire, the effective bonding area over which the wire bonds to an electrode is so small that the wire does not firmly bond to the electrode. There is no particular upper limit to the height of the face surface. However, from the viewpoint of high-density bonding of wire, it is preferable that the height of the face surface be greater than the thickness of the wire by about several μm at most. The width (diameter) of a capillary is determined by the aforementioned inclination angle and height of the face surface. In a case where wire is bonded to a top-surface electrode of a semiconductor device, however, from the viewpoint of firmer bonding of the wire to the top-surface electrode, it is recommended that, as seen in a side sectional view including the axis of the capillary, the width D (shown in FIG. 1) of the face surface in the direction perpendicular to the axis of the capillary be made greater than the width d (shown in FIG. 1) of the semiconductor device in the same direction.

Figure 1:
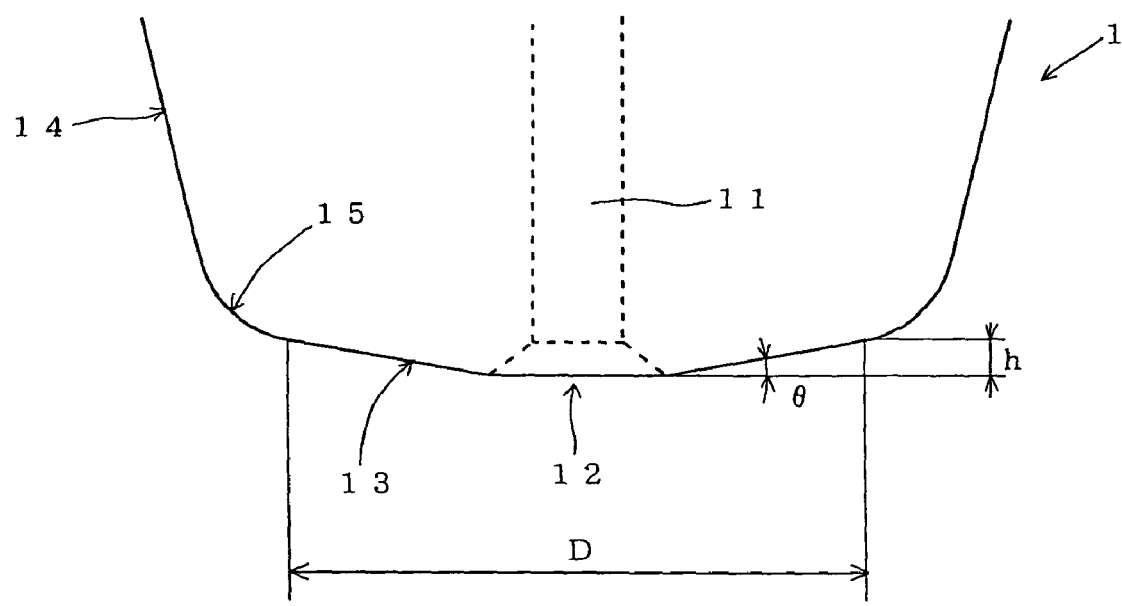
FIG. 1 is a side view showing an example of a capillary according to the invention.
Figure 1:
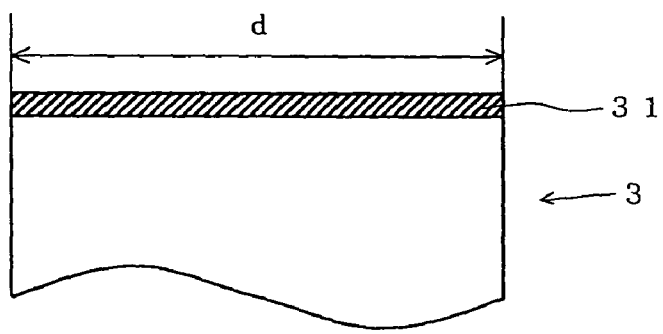

FIG. 1 shows an enlarged sectional view of the tip portion of an example of a capillary according to the invention. The capillary 1 shown in FIG. 1 has substantially the shape of an inverted cone, has a through hole 11 formed through the axial center thereof to permit wire 2 to be placed therethrough, and has a face surface 13 formed at the tip end thereof. The through hole 11 has an opening 12 formed at the bottom end thereof so as to have increasingly large diameters outward, and this opening 12 is located at the center of the face surface 13. On the other hand, the face surface 13 inclines upward at an angle of θ=8° from the opening 12 of the through hole 11 radially outward, and connects, at where its height h becomes equal to the thickness of the wire 2 (30 μm across), to the curved-surface portion 15, which in turn connects to the peripheral surface 14 of the capillary.

Figure 2A:
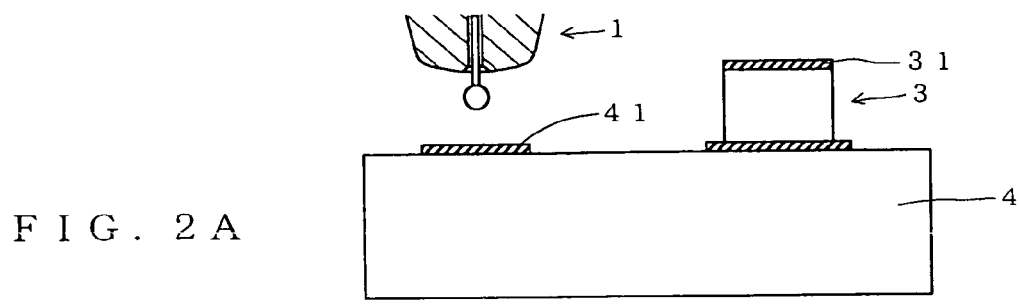
FIGS. 2A to 2E are diagrams showing how wire bonding proceeds when performed by the use of a capillary according to the invention.
Figure 2B:
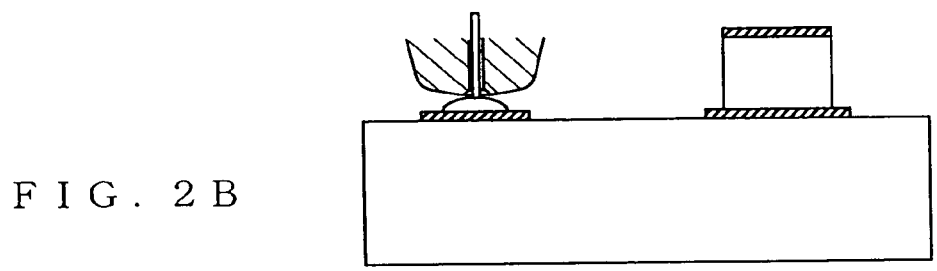
Figure 2C:
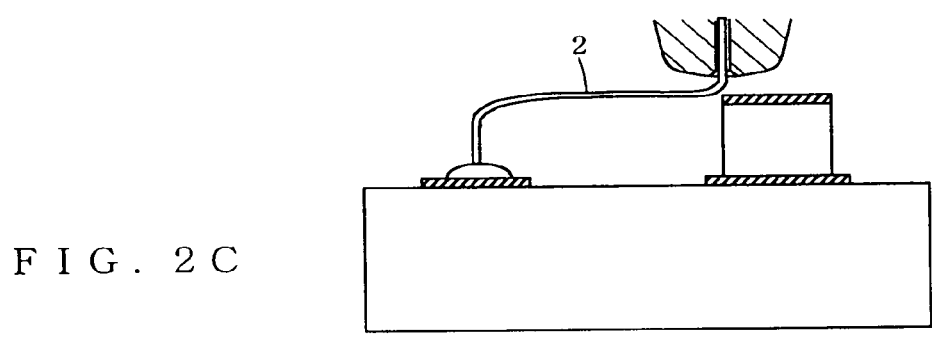
Figure 2D:
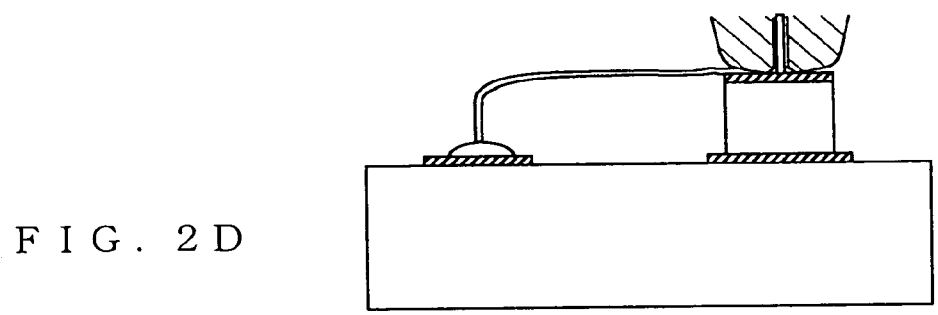
Figure 2E:
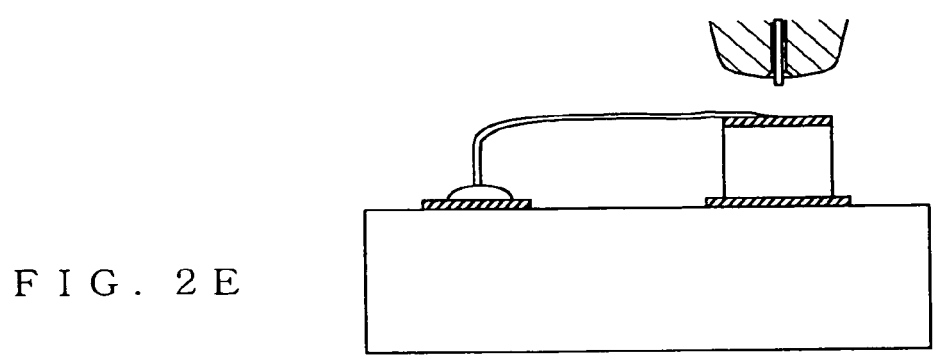

Now, an example of how the mounting of a semiconductor device 3 on a circuit board 4 proceeds when performed by the use of the capillary 1 structured as described above will be described with reference to FIGS. 2A to 2E. First, by electric discharge from a torch electrode (not shown), the tip of wire 2 extracted from the capillary 1 through the opening 12 at the tip thereof is formed into a ball-like shape (FIG. 2A). Next, the capillary 1 is moved down so that the tip of the wire formed into the ball-like shape is pressed onto an electrode 41 formed on the circuit board 4, and then, by application of a supersonic vibration, the wire 2 is bonded to the electrode 41 (FIG. 2B). Next, the capillary 1 is moved to a position slightly higher than the height of the semiconductor device 3 and simultaneously moved to above the semiconductor device 3, which is bonded on an electrode on the circuit board (FIG. 2C). Next, the capillary 1 is moved down so as to be pressed onto a top-surface electrode 31, and, by simultaneous application of a predetermined load and a supersonic vibration, the wire 2 is bonded to the top-surface electrode (FIG. 2D). Thereafter, with the wire clamped, the capillary 1 is moved up, and then the wire 2 is cut (FIG. 2E).

Figure 3:
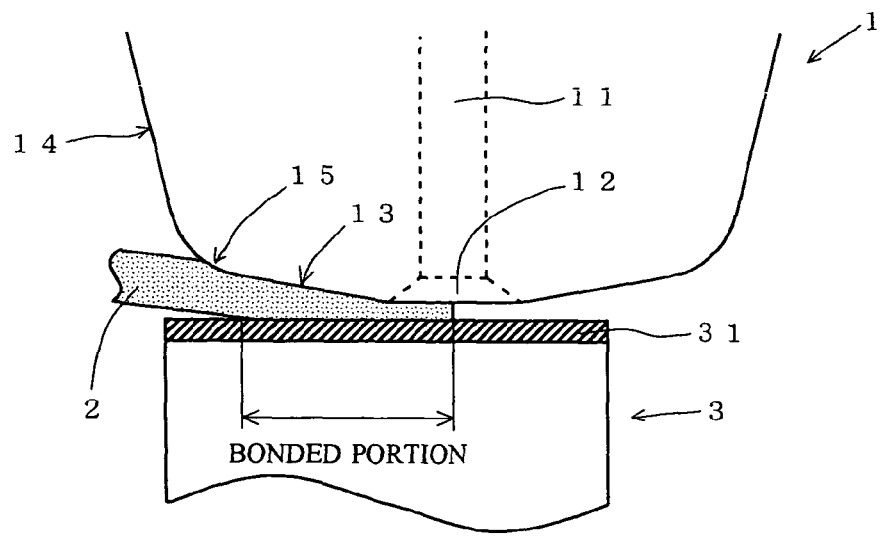
FIG. 3 is a diagram showing how stitch bonding is effected by the use of a capillary according to the invention.
Figure 4:
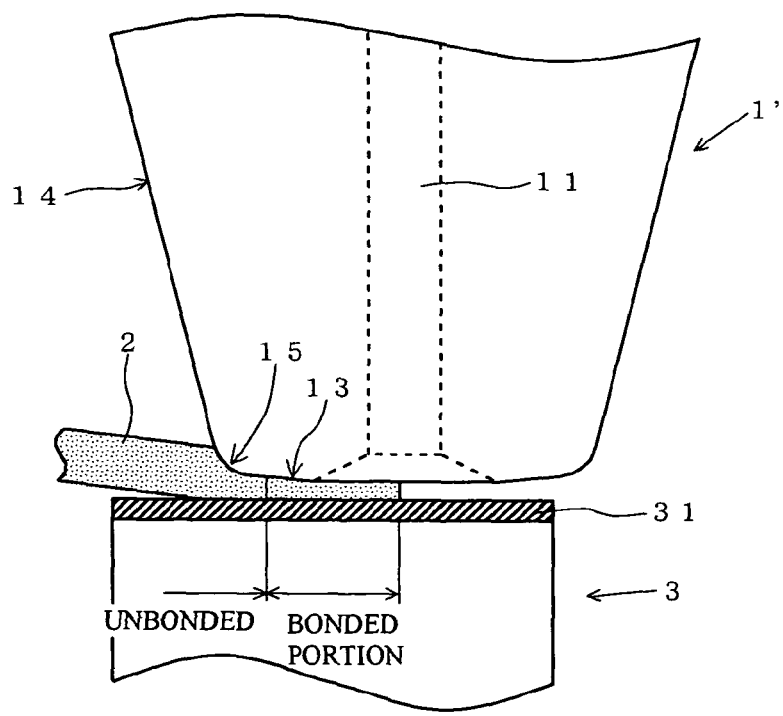
FIG. 4 is a side view of a conventional capillary.

FIG. 3 shows how the wire 2 bonds to the top-surface electrode 31. As will be understood from FIG. 3, since the capillary 1 has the face surface 13 formed at the tip thereof and the face surface 13 is given an inclination angle and a height as described earlier, the wire 2 bonds to the top-surface electrode 31 over a wider bonding area than ever. Moreover, since the predetermined load is applied to all over this bonding area, the wire 2 firmly bonds to the top-surface electrode 31. This prevents troubles such as breakage and peeling-off of the wire.

In addition, the wire 2 is bonded to the electrode 41 on the circuit board 4 by first bonding, and is bonded to the top-surface electrode 31 of the semiconductor device 3 by second bonding. This helps to make the angle between the wire 2 and the top-surface electrode 31 of the semiconductor device 3 extremely small, and thereby prevent mechanical and thermal stress from concentrating at part of the bonded portion of the wire 2, contributing to securer prevention of wire breakage and the like. Simultaneously, it is possible to make the loop of the wire 2 smaller, and thereby make the semiconductor device thin.

In stitch bonding whereby wire is bonded by being pressed and deformed with the face surface of a capitally, there is no particular limit to the load applied to the capillary; the load is determined appropriately according to the type of the wire used, a generally preferred range of the load being from 100 $g/cm^2$ to 200 $g/cm^2$. There is no particular restriction on the wire used in the present invention; the wire may be of any conventionally known type, of which a preferred example is Au wire.

What is claimed is:

1. A method of wire bonding including steps of bonding wire to an external electrode and then bonding the wire to a top-surface electrode of a semiconductor device,
   wherein wire bonding is performed by use of a capillary having a face surface formed at a tip end thereof, the face surface inclining toward a center thereof so as to have a tapered shape, the capillary having a through hole formed therethrough so as to permit wire to be placed therethrough, the through hole having an opening at the center of the face surface,
   wherein an angle of inclination of the face surface relative to a plane perpendicular to an axis of the capillary and including the opening of the through hole is in a range from 4° to 15°, and a height of the face surface along the axis of the capillary is equal to or greater than a thickness of the wire, and
   wherein, when seen in a side sectional view including the axis of the capillary, a width of the face surface in a direction perpendicular to the axis of the capillary is greater than a width of the semiconductor device.

2. A method of wire bonding as claimed in claim 1, wherein the angle of inclination of the face surface is in a range from 8° to 12°.

3. A method of wire bonding as claimed in claim 1, wherein a load applied to the capillary when the wire is pressed and deformed with the face surface of the capillary so as to bond to the top-surface electrode of the semiconductor device is in a range from 100 to 200 $g/cm^2$.

4. A method of wire bonding comprising:
   bonding a first end of the wire to an external electrode using a capillary, the capillary having a face surface formed at a tip end, and inclining toward a center thereof, so as to have a tapered shape, the capillary also having a through hole to permit a wire to be placed therethrough, the through hole having an opening at the center of the face surface, and an angle of inclination of the face surface relative to a plane perpendicular to an axis of the capillary and including the opening of the through hole is in a range from 4 to 15; and bonding a second end of the wire to a top-surface electrode of a semiconductor device using the capillary, wherein the capillary, when seen in a side sectional view including the axis of the capillary, has a width of the face surface in a direction perpendicular to the axis of the capillary that is greater than a width of the semiconductor device.

5. The method of claim 4, wherein the capillary has a height of the face surface along the axis of the capillary that is equal to or greater than a thickness of the wire.

6. The method of claim 4, wherein the capillary has a uniform angle of inclination.

* * * * *